(12) United States Patent
Yokoi et al.

(10) Patent No.: US 7,141,797 B2
(45) Date of Patent: Nov. 28, 2006

(54) RADIATION DETECTOR AND RADIATION APPARATUS

(75) Inventors: Kazuma Yokoi, Hitachi (JP); Hiroshi Kitaguchi, Naka (JP); Kikuo Umegaki, Hitachinaka (JP); Kensuke Amemiya, Hitachinaka (JP); Yuuichirou Ueno, Hitachi (JP); Norihito Yanagita, Hitachi (JP); Shinichi Kojima, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 88 days.

(21) Appl. No.: 10/402,970

(22) Filed: Apr. 1, 2003

(65) Prior Publication Data

US 2005/0098730 A1 May 12, 2005

(30) Foreign Application Priority Data

Apr. 2, 2002 (JP) .............................. 2002-099477

(51) Int. Cl.
*G01T 1/24* (2006.01)
(52) U.S. Cl. ................................... 250/370.1
(58) Field of Classification Search ............ 250/370.01
See application file for complete search history.

(56) References Cited

U.S. PATENT DOCUMENTS

| | | | |
|---|---|---|---|
| 4,837,607 A | 6/1989 | Kemmer et al. | |
| 4,878,120 A | 10/1989 | Matsumoto et al. | |
| 5,677,539 A | 10/1997 | Apotovsky et al. | |
| 5,786,609 A | 7/1998 | Kemmer et al. | |
| 6,002,134 A | 12/1999 | Lingren et al. | |
| 6,037,595 A * | 3/2000 | Lingren | 250/370.01 |
| 6,316,773 B1 * | 11/2001 | Giakos | 250/394 |
| 6,333,504 B1 * | 12/2001 | Lingren et al. | 250/370.01 |
| 6,781,132 B1 * | 8/2004 | McGregor | 250/370.09 |

FOREIGN PATENT DOCUMENTS

| | | |
|---|---|---|
| EP | 0642178 | 3/1995 |
| EP | 0777277 | 6/1997 |
| EP | 1092974 | 4/2001 |
| JP | 59188278 | 10/1984 |
| JP | 9-171081 | 6/1997 |
| JP | 10512372 | 7/1999 |
| JP | 11186285 | 7/1999 |
| JP | 2000-121738 | 4/2000 |
| JP | 2000121738 | 4/2000 |
| JP | 3093799 | 7/2000 |
| WO | WO 99/03155 | 1/1999 |
| WO | WO-0178153 | 10/2001 |

OTHER PUBLICATIONS

Partial European Search Report
European Search Report, dated Apr. 28, 2006.
JP Office Action, dated Apr. 25, 2006.

* cited by examiner

*Primary Examiner*—David Porta
*Assistant Examiner*—Marcus Taningco
(74) *Attorney, Agent, or Firm*—Dickstein Shapiro LLP

(57) ABSTRACT

A practical semiconductor radiation detector capable of collecting electrons rapidly with a large volume is disclosed. A multiple layers of grid electrodes around an anode formed on a semiconductor element limits the generation of the induced charge signal for the anode to the space in the neighborhood of the anode, while at the same time making it possible to collect the electrons rapidly. As a result of limiting the space for generating the induced charge by the grid electrodes, the energy resolution is improved even for a thick semiconductor element. Also, the capability of rapidly collecting the electrons due to the high field strength generated by the grid electrodes makes a sensitive volume of the whole semiconductor and thus achieves a high radiation detection efficiency.

12 Claims, 12 Drawing Sheets

RADIATION DETECTOR AND RADIATION APPARATUS

BACKGROUND OF THE INVENTION

The present invention relates to a radiation detector and a radiation apparatus.

In recent years, the ionizing radiation has been detected mainly by use of a semiconductor element. The radiation is transformed into positive holes and electrons by the semiconductor element. A cathode and an anode are formed on the surface of the semiconductor element, and the positive holes and the electrons are detected by applying a voltage between the cathode and the anode. Specifically, an electric field is formed between the cathode and the anode, and the positive holes and the electrons are moved toward the cathode and the anode, respectively. With the movement of the positive holes and the electrons, the voltages induced in the cathode and the anode are detected.

The electrons and the positive holes have a mean life unique to the base material of the semiconductor. Especially, the positive holes tend to become extinguished within a comparatively short time. In the case where a signal is acquired in a given electrode, another electrode having a constant potential arranged around the given electrode can shield the charge induced in the signal-acquiring electrode due to the movement of the charge outside the second electrode. In view of this, a technique has been conceived in which an electrode is arranged in the neighborhood of an anode as a shield electrode impressed with a voltage intermediate the anode voltage and the cathode voltage. The shield electrode is often called a Frisch grid electrode. The structure of this electrode makes it possible to detect the positive holes comparatively efficiently even in the case where they are extinguished within a short time. This technique is described, for example, in JP-A-9-171081, JP-A-2000-121738 or JP-A-10-512372.

SUMMARY OF THE INVENTION

According to the prior art described above, however, the electric field outside the grid electrode is greatly weakened in the neighborhood of the surface of the anode. In this area, it takes a long time to collect electrons so that the signal detection is delayed unavoidably. Also, a shorter mean life distance of the electrons reduces the energy resolution and hence the detection efficiency. The object of the present invention is to provide a radiation detector having an improved detection accuracy and a radiation apparatus comprising the detector.

In order to achieve the aforementioned object, according to a first aspect of the invention, there is provided a radiation detector comprising a first grid electrode impressed with a voltage not lower than the cathode voltage but not higher than the anode voltage and less distant from the anode than from the cathode and a second grid electrode formed on the side of the first grid electrode far from the anode and impressed with a voltage lower than the voltage of the first grid electrode.

According to a second aspect of the invention, there is provided a radiation detector comprising a first grid electrode and a second grid electrode for forming an electric field with the first grid electrode.

According to a third aspect of the invention, there is provided a radiation detector comprising a first grid electrode formed on the surface of a semiconductor element at a predetermined distance from the anode and a second grid electrode arranged at a predetermined distance from the first grid electrode on the part of the surface of the semiconductor element far from the anode, wherein the anode voltage is not lower than the voltage of the first grid electrode, which in turn is higher than the voltage of the second grid electrode, which in turn is higher than the cathode voltage.

According to a fourth aspect of the invention, there is provided a radiation detector comprising a plurality of grid electrodes formed on a semiconductor element at a predetermined distance from the anode, wherein the grid electrodes can be impressed with a voltage independently of each other.

According to a fifth aspect of the invention, there is provided a radiation detector comprising double grid electrodes surrounding the anode, wherein double grid electrodes can be impressed with a voltage independently of each other.

According to a sixth aspect of the invention, there is provided a radiation detector comprising a plurality of grid electrodes arranged around a plurality of anodes, respectively, wherein a plurality of the grid electrodes are combined into a signal grid electrode in such a manner as to be supplied with the same potential, and each grid electrode surrounds the corresponding anode without crossing the electrodes of other potentials.

According to a seventh aspect of the invention, there is provided a radiation detector comprising a plurality of grid electrodes arranged inside and outside a ring-shaped anode and adapted to be impressed with a voltage independently of each other.

According to an eighth aspect of the invention, there is provided a radiation detector comprising a plurality of ring-shaped anodes formed on a surface different from a predetermined surface of a semiconductor element and a plurality of grid electrodes each arranged around the corresponding one of the anodes, wherein a plurality of grid electrodes are arranged inside and outside the anodes, respectively, as a single electrode capable of being impressed with a voltage independently without crossing other electrodes in the same plane.

According to a ninth aspect of the invention, there are provided a radiation detector comprising a plurality of grid electrodes formed on a semiconductor element at a predetermined distance from a plurality of anodes, respectively, wherein the cathodes, the anodes and the grid electrodes are combined into a plurality of sets each including a cathode, an anode and a grid electrode, wherein the signals output from the anode and the cathode of each set are applied to a package board of a signal reading circuit, and wherein a bump solder is inserted to establish electric conduction between a plurality of reading portions of the detector and a plurality of reading portions of the package board of the signal reading circuit.

According to a tenth aspect of the invention, there are provided a radiation detector comprising a combination of a plurality of substantially conical or substantially pyramidal semiconductor elements irradiated for generating positive holes and electrons, wherein a cathode is formed on the bottom surface portion of each of the semiconductor elements, and an anode is formed at the top portion of each of the semiconductor elements, and wherein a grid electrode is formed at a predetermined distance from the anode of each semiconductor element, the semiconductor elements being combined substantially in the shape of sphere.

According to an 11th aspect of the invention, there are provided a radiation detector comprising a semiconductor element irradiated for generating the charge, an anode formed on the semiconductor element, a cathode formed on the semiconductor element, a plurality of independent grid electrodes formed on the semiconductor element in the neighborhood of the anode in such a manner as to surround the anode in a plurality of layers. The radiation detector having this electrode structure according to the invention has an appropriate field strength distribution and can rapidly and efficiently collect the charge generated in the semiconductor element, thereby exhibiting a performance of remarkably improving the detection efficiency and the energy resolution.

Other objects, features and advantages of the invention will become apparent from the following description of the embodiments of the invention taken in conjunction with the accompanying drawings.

DESCRIPTION OF THE EMBODIMENTS

Figure 1:
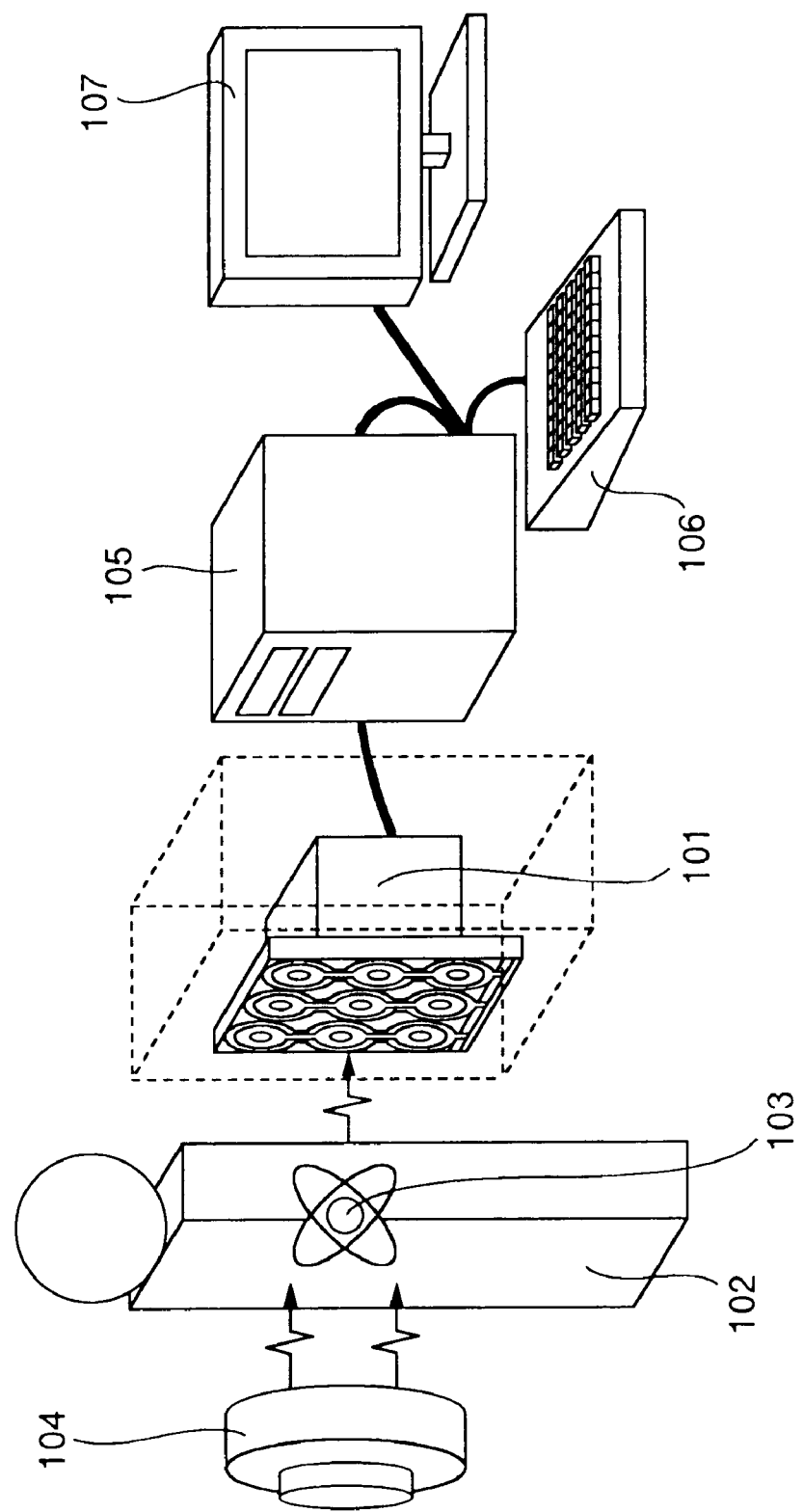
FIG. 1 is a diagram showing a configuration of a multiple-grid electrode radiation detector according to the invention.

The present invention will be described below in detail with reference to embodiments thereof. FIG. 1 shows a configuration of a multiple-grid electrode radiation detector according to the invention. A multiple-grid electrode radiation detector 101 detects the radiation generated from a radio isotope 103 dosed in a human body 102 or a radiation generator 104. The radio isotope 103 includes F-18 contained in FDG (fluorodeoxy glucose) or Tc-99m contained in Neurolite (99 mTc-ECD) having a chemical form concentrated in the seat of a disease in the human body. The radiation generator 104 includes an X-ray generator. The multiple-grid electrode radiation detector 101 is connected to a data collection-analyzer 105 in a subsequent stage, and together with an input/output device 106 and an imaging/display device 107, makes up a radiation imaging system.

Figure 2:
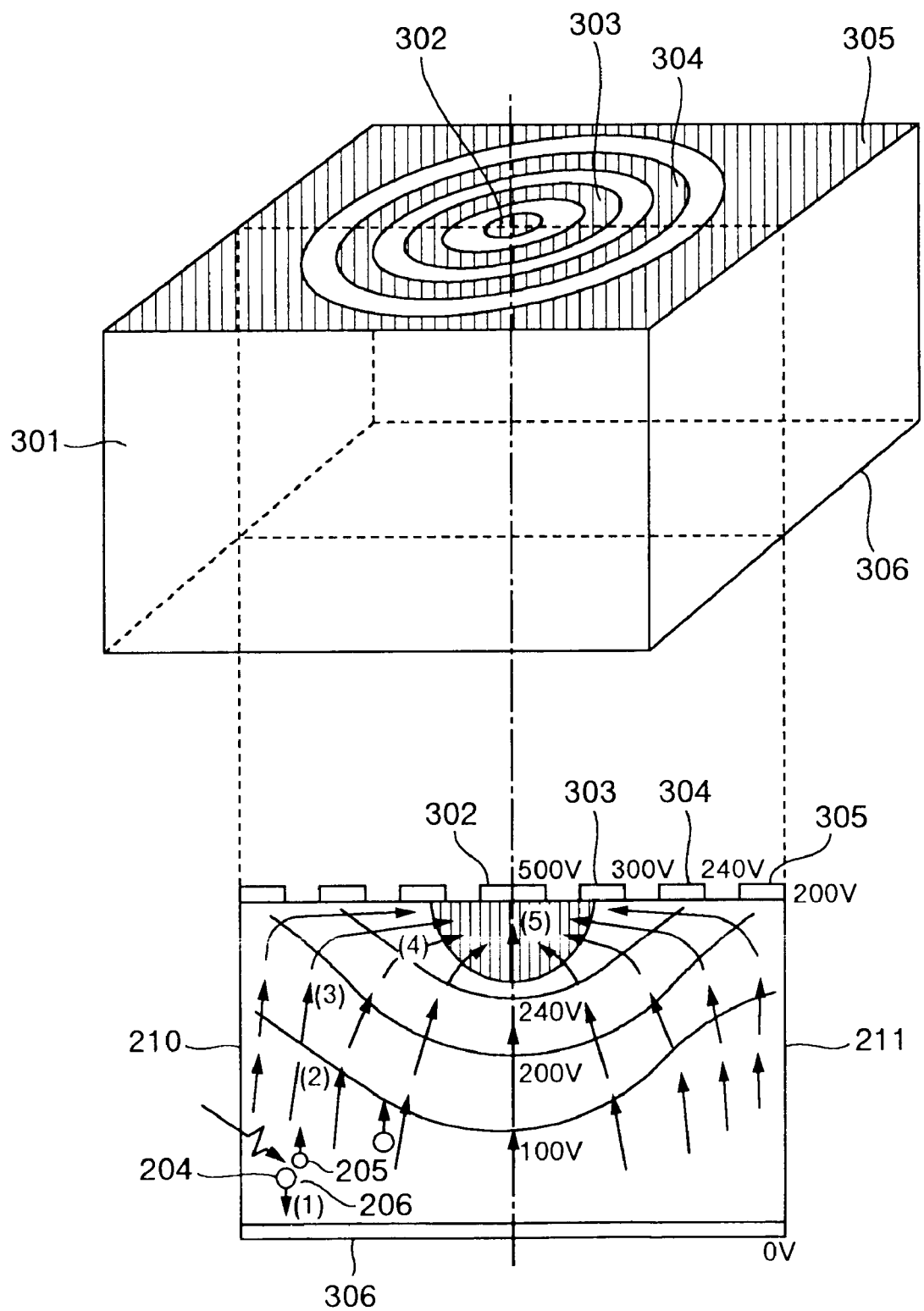
FIG. 2 is a diagram showing electrode structure of a multiple-grid electrode radiation detector.
Figure 3:
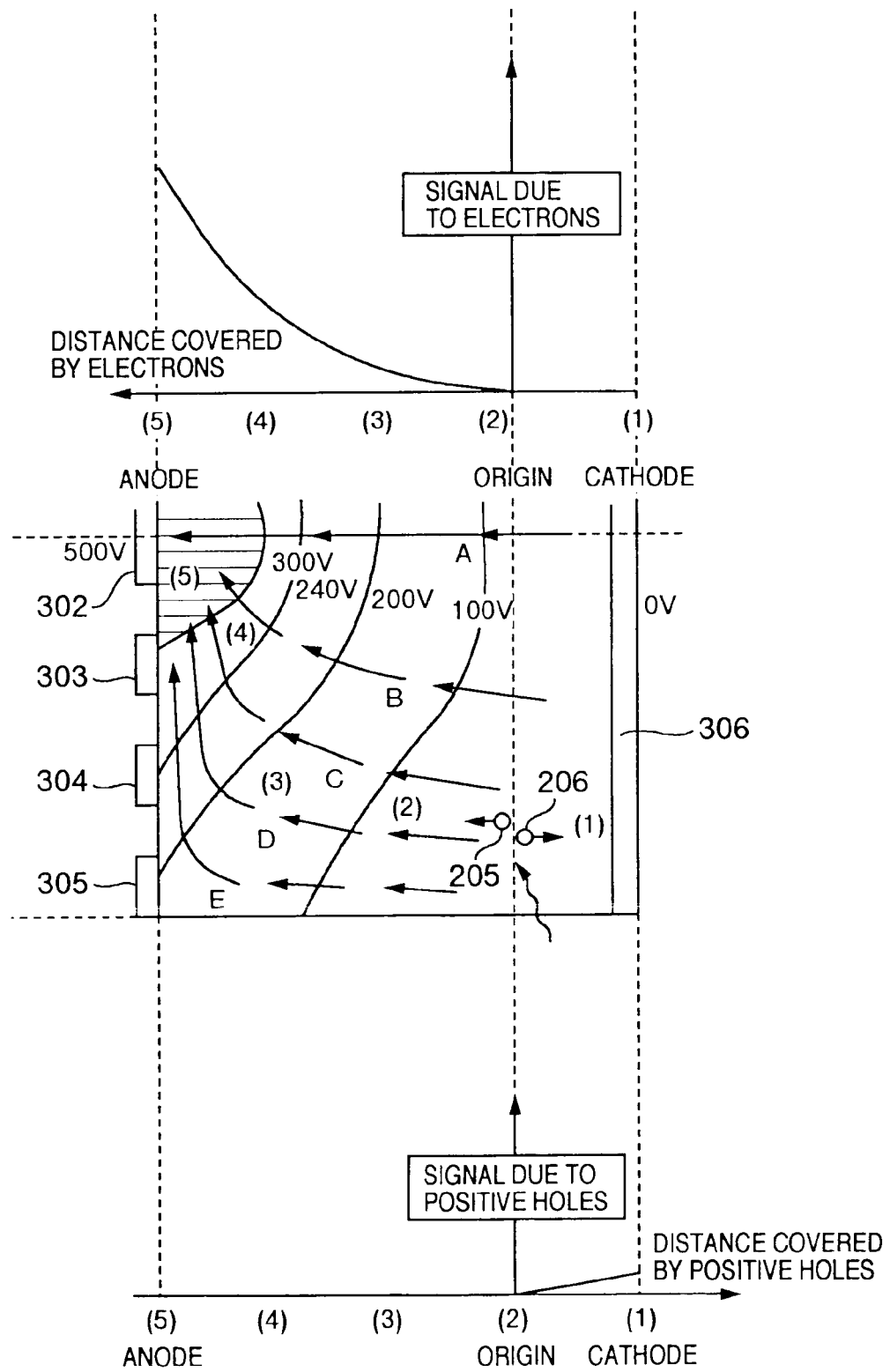
FIG. 3 shows the detail of an electrode structure of a multiple-grid electrode radiation detector.

FIGS. 2 and 3 show the detail of a multiple-grid electrode radiation detector. The multiple-grid electrode radiation detector is configured of a semiconductor element 301 and a plurality of electrodes formed on the semiconductor element 301. The semiconductor element 301 has, on a part of the surface thereof, a circular anode 302, and a ring-shaped set of a first grid electrode 303, a second grid electrode 304 and a third grid electrode 305 surrounding the circular anode 302. The first grid electrode 303 (the grid electrode nearest to the anode) is arranged on the semiconductor element 1 and surrounds the whole periphery of the anode in the same plane. The second grid electrode 304 surrounds the first grid electrode 303, and the third grid electrode 305 surrounds the second grid electrode 304. The semiconductor element 301 has a cathode 306 on the surface thereof opposed to the surface having the anode 302 and the grid electrodes 303 to 305.

In the detector comprising the anode 302 and the cathode 306 in the form of tabular two electrodes for detecting the ionizing radiation, a large distance between the anode 302 and the cathode 306 is required to secure a large thickness, especially, for the purpose of improving the efficiency of detecting the photon radiation (X ray, γ ray). The electrons and the positive holes have a mean life unique to the semiconductor making up the base material. Also, the electrons and the positive holes have a velocity corresponding to the field strength in the semiconductor and can move only over the distance equal to the product of the velocity thereof and the life thereof. This distance is generally about ten times longer for electrons than for positive holes. In the case where the distance from the anode 302 to the cathode 306 is larger than the movable distance of positive holes, the positive holes may be unable to reach the cathode due to the phenomenon of positive holes being trapped. Incomplete charge collection reduces the energy resolution of the detector. Therefore, the first grid electrode 303 is arranged so that the degree of contribution of the space to the signal output is concentrated in the neighborhood of the anode. In this way, a signal can be produced by preference of easily-collected electrons and by suppressing the induced charge due to the ill-collected positive holes.

In FIG. 2 for example, assume that the photon radiation (X ray, γ ray) enters the semiconductor element 301. The ionizing radiation 204 reacts with the atoms in the semiconductor element 301 with a probability corresponding to the energy of the photon radiation. As a result, electrons 205 and positive holes 206 are generated by ionization in the semiconductor element 301. The electrons 205 move toward the anode 302 and the positive holes 206 toward the cathode 306 while at the same time generating the induced charge in the anode 302. The induced charge is the charge induced for each electrode by the movement of the electrons and the positive holes generated by the reaction with the radiation in the detector. The voltage signal produced in the anode 302 is proportional to the amount of the induced charge generated. By arranging the first grid electrode 303 in the neighborhood of the anode 302, the area where the induced charge is generated for the anode 302 when the electrons 205 or the positive holes 206 move can be concentrated in a small range from the anode 302 to the first grid electrode 303. As a result, the induced charge which otherwise might be generated by the movement of the positive holes 206 is not generated in the anode 202. Even in the case where the positive holes 206 are lost by the hole trapping reaction before managing to reach the cathode 306, the pulse height of the voltage signal is not affected. Even in the case where the distance between the anode 302 and the cathode 306 is increased to such an extent as to increase the probability of the positive holes being trapped, therefore, a signal can be secured without losing the energy information.

A more detailed explanation will be given with reference to FIG. 3. Position (1) indicates the cathode 306 and corresponds to a voltage of 0 V. Position (2) corresponds to a voltage of 100 V, and position (3) corresponds to a voltage of 200 V. Positions (1) to (3) have substantially the same field strength. Position (4), however, corresponds to a voltage of 300 V. In spite of a comparatively short distance between position (4) and position (5) (cathode 306), the voltage sharply rises from 300 V to 500 V. In other words, the electric field is concentrated in the neighborhood of the cathode 306.

The field strength from position (1) to position (2) is substantially equal to the field strength from position (2) to position (3) (although the field strength from (2) to position (3) is somewhat higher). The field strength from position (2) to position (3), the field strength from (3) to (4) and the field strength from (4) to (5) are progressively increased in that order. Especially, the field strength from position (4) to (5) is considerably higher than the other field strengths.

Arrows A to E indicate the direction of movement of the electrons 205. Outward from the center axis (i.e. in the direction of arrows A to E), the distance between position (1) and position (2) is not increased. In the direction from position (2) to position (5), however, the distance variation is decreased among the arrows A to E. In other words, the nearer the anode 302, the boundary comes to assume a form more analogous to that of a concentrated field.

The equipotential line at position (2) extends from the center line to side walls 210, 211. Also at position (3), the equipotential line extends to the third grid electrode 305 located substantially on the side walls. The equipotential line at position (4), on the other hand, extends to the second grid electrode 304 which is located nearer to the side walls than a line associated with an equal distance between the center line and the side walls.

This indicates that even in the case where an electron 205 is generated at a position near to both the side walls and the anode 302 in FIG. 2, the electron 205 is energized toward the anode 302 by the equipotential line (3) and further continues to be energized by the equipotential line (4) toward the anode 302. Specifically, regardless of the position where the electron 205 or the positive hole 206 is generated in the semiconductor element 301, it is rapidly energized toward the anode 302 or the cathode 306.

Assume that the electron 205 and the positive hole 206 are generated by the ionizing radiation 204 in the neighborhood of position (2) in FIG. 3. The positive hole 206 moves toward the cathode 306 and when it proceeds by a unit distance, a signal strength corresponding to the field strength is induced in the cathode 306. Similarly, with the movement of the electron 205 toward the anode 302, a predetermined signal is induced in the anode 302. This signal is output in accordance with the degree to which the space contributes to the signal output. In other words, the signal output is induced in the cathode 306 and the anode 303 as shown in FIG. 3.

The time before extinction of the electrons 205 is comparatively long. No matter where they are generated in the semiconductor element 301, therefore, most of the electrons 205 reach the anode 302. On the other hand, the time before extinction of each positive hole 206 is so short that it is extinguished with the movement only over a short distance. In view of this, the signal due to the positive holes moving in the space farther than the first grid electrode 303 from the anode 302 are prevented from being output to the anode 302.

In the case where a signal is to be acquired from a given electrode, assume another electrode impressed with a constant potential is arranged around the signal acquisition electrode. Then, it is possible to shield the induced charge for the signal acquisition electrode which otherwise might be caused by the movement of the charge outside the electrode impressed with the constant potential.

Assume, for example, that the positive hole 206 is generated near the cathode 306 such as position (4). According as the positive hole 206 moves toward the cathode 306, the signal strength induced in the anode 302 is reduced. As a result, the overall signal strength is not greatly affected and therefore the instability of the output signal can be reduced. The distance between the anode 306 and the first grid electrode 303 is preferably shorter than the mean life distance of the electrons depending on the semiconductor device.

By applying an appropriate bias to the first grid electrode 303, therefore, the first grid electrode 303 comes to have the function of narrowing the area where the induced charge can be generated for the anode 302. As a result, the positive hole substantially fails to generate the induced charge in the anode 302 and the reduction in energy resolution which otherwise might be caused by trapping of the positive holes can be suppressed. Also, in the case where a bias lower than the anode 302 is applied to the first grid electrode 303, a bias lower than the first grid electrode 303 is applied to the second grid electrode 304 and a bias lower than the second grid electrode 304 is applied to the third grid electrode 305, progressively in that order, the electric field is strengthened over the entire internal area of the semiconductor element 301 by the grid electrodes including the first grid electrode 303 to the third grid electrode 305, thereby making it possible to collect the charge rapidly. In the conventional Frisch grid electrode radiation detector, the electric field, even somewhat away from the anode 302, is greatly weakened. Nevertheless, the multiple grid electrodes can improve substantially the whole area of the semiconductor element can be formed as a sensitive volume.

The PET (positron emission tomography), in which measurement is made simultaneously at positions 180 degrees opposed to each other and the detection efficiency is determined by the square of the detection efficiency of one of the detectors, plays an important role in improving the detection efficiency. As compared with the conventional detector having an efficiency of about 5% (5×5×5 mm$^3$ CdTe element) the detection efficiency of the element according to this invention is improved by about 20%. This detection efficiency, as converted into the corresponding efficiency for PET, is defined as 4% versus 0.25% or up about 16 times.

Also, the time is shortened from the reaction between the radiation and the semiconductor element to the end of signal generation, and therefore the time difference is reduced for signal generation due to the difference of the position of reaction in the semiconductor element. This also greatly contributes to an improved real measurement time resolution for fast real measurement in PET. As a result, the effect of maintaining the performance not more than 10 ns of the real time resolution is exhibited as compared with 16 ns for the conventional detector.

The number of the multiple grid electrodes may not necessarily be three but may be two or ten. Also, the bias may be applied in any appropriate manner. For example, among the electrodes having a similar shape to those shown in FIG. 3, the first grid electrode 303 may be used as an anode, and the anode 302 and the second grid electrode 304 may be used as the nearest grid electrodes. In this case, the part around the anode where the electric field has a high strength becomes so wide that the time dependency of the signal due to the position of reaction in the semiconductor element 301 is further reduced.

By keeping the potential difference between the anode 302 and the first grid electrode 303 at a level not excessively large, the leakage current between the anode 302 and the first grid electrode 303 can be reduced. A reduced leakage current leads to an improved S/N and can improve the energy resolution of the detector.

Next, the semiconductor element 301 according to a modification of the invention will be explained with reference to FIG. 4. Another modification is described with reference to FIG. 5. In both modifications, the following description assumes that the semiconductor element 301 shown in FIG. 3 can be used as a replacement.

Figure 4:
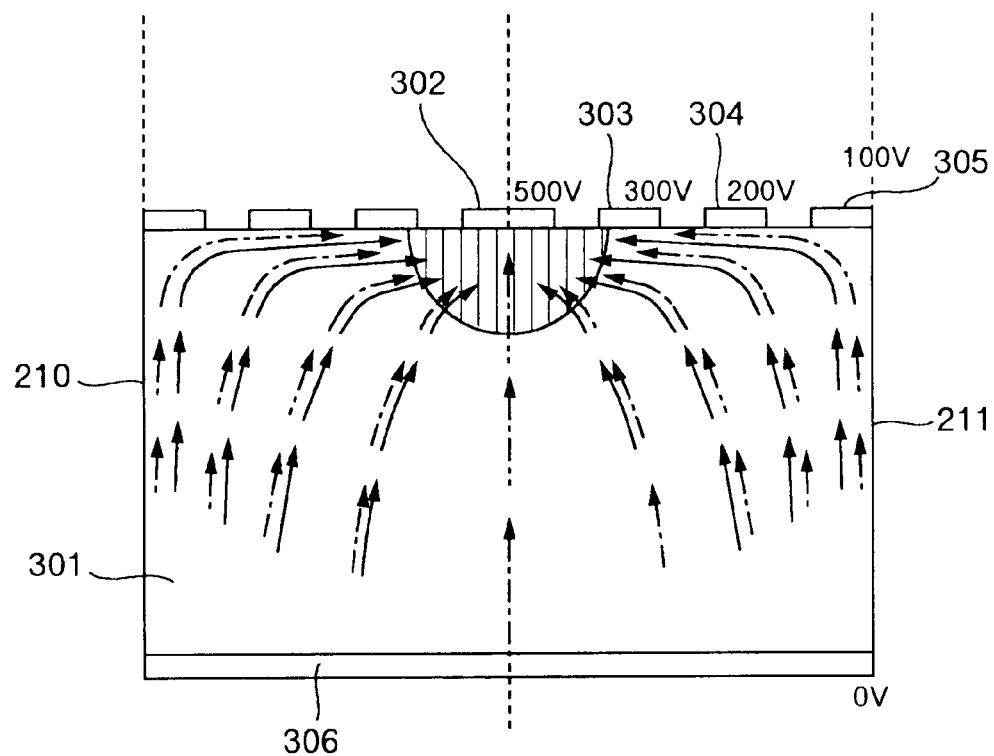
FIG. 4 shows the detail of an electrode structure of a multiple-grid electrode radiation detector according to a modification of the invention.

In FIG. 4, a voltage of 200 V is applied to the second grid electrode 304, and a voltage of 100 V is applied to the third grid electrode 305. Specifically, as compared with the embodiments shown in FIGS. 2 and 3, both the voltage applied to the second grid electrode 304 and the voltage applied to the third grid electrode 305 are low. The other parts are similar to the corresponding parts of the embodiments shown in FIGS. 2 and 3 and therefore will not be described again. In FIG. 4, the thick arrows indicate electrical lines of force according to the embodiment shown in FIG. 4, and the one-dot chains electrical lines of force according to the embodiment shown in FIGS. 2 and 3.

As described above, in the case where the voltage applied to the second grid electrode 304 and the voltage applied to the third grid electrode 305 are reduced, the field strength remains substantially the same as that of the aforementioned embodiments on the center axis of the semiconductor element. Progressively toward the side walls of the semiconductor element 301 from the center axis, however, the electrical lines of force gradually come to deviate away toward the side opposite to the side walls 210, 211. In other words, the electrons 205 are accelerated toward the anode 302 at positions nearer to the side walls with a smaller force than in the aforementioned embodiments, hereby reducing the collection rate of the electrons 205.

Figure 5:
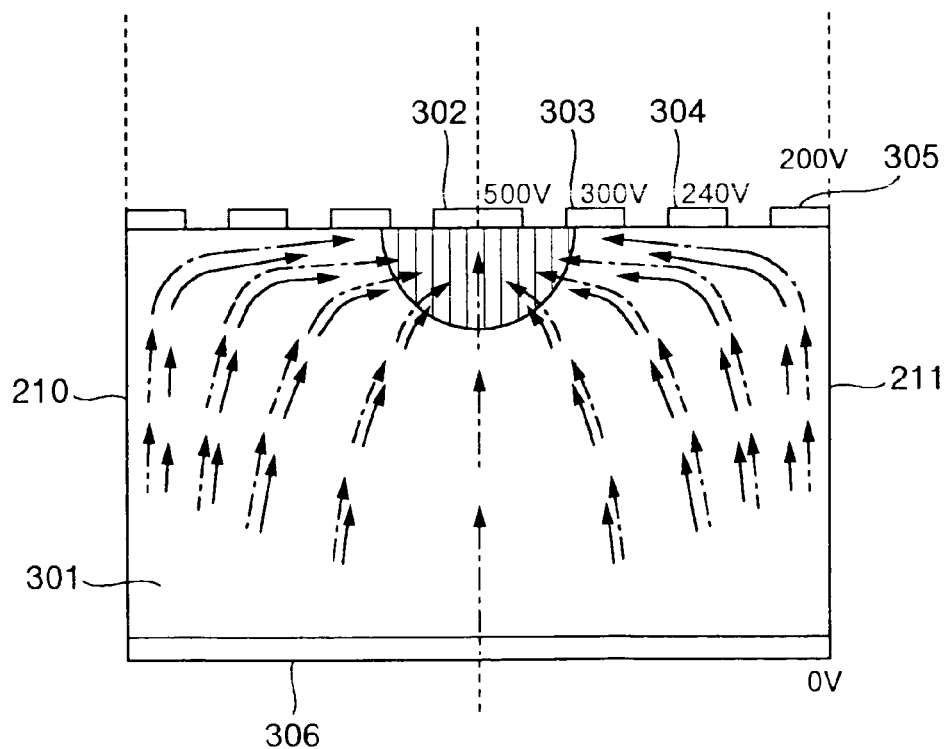
FIG. 5 shows the detail of an electrode structure of a multiple-grid electrode radiation detector according to another modification of the invention.

Next, still another embodiment will be explained with reference to FIG. 5. The voltage applied to the second grid electrode 304 and the voltage applied to the third grid electrode 305 are the same as those in the embodiment of FIGS. 2 and 3. In the embodiment shown in FIGS. 2 and 3, the distance between the anode 302 and the first grid electrode 303, the distance between the first grid electrode 303 and the second grid electrode 304 and the distance between the second grid electrode 304 and the third grid electrode 305 are set to substantially the same length. In the case of FIG. 5, in contrast, the distance between the anode 302 and the first grid electrode 303, the distance between the first grid electrode 303 and the second grid electrode 304 and the distance between the second grid electrode 304 and the third grid electrode 305 are set in progressively ascending values.

By setting the distances as described above, the electric field for collecting the electrons 205 around the anode 302 is increased as compared with the embodiment shown in FIGS. 2 and 3.

Figure 6:
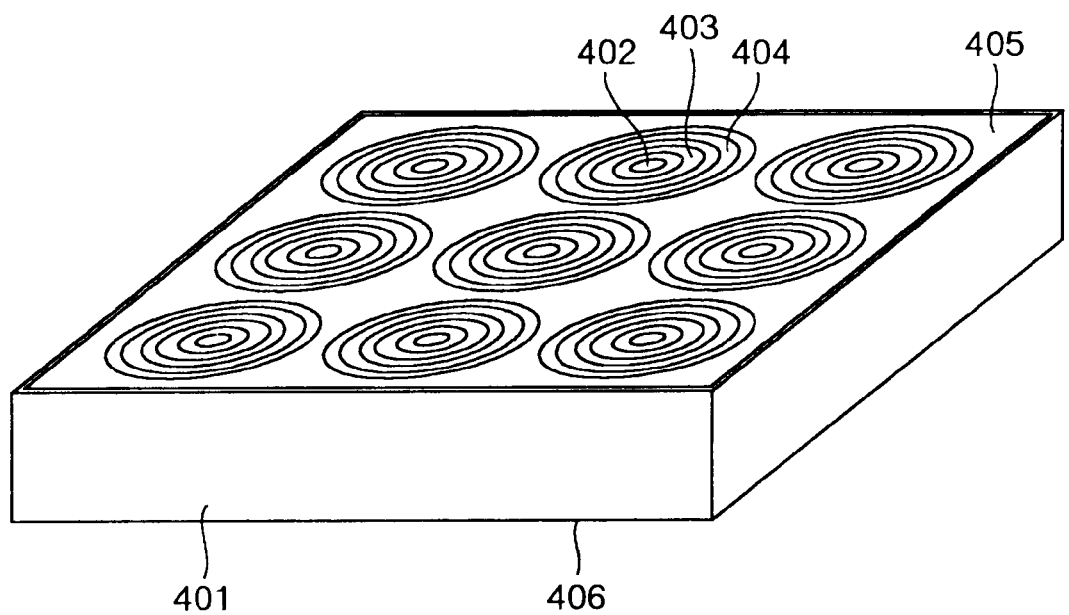
FIG. 6 is a diagram showing a multiple-grid electrode radiation detector in two-dimensional array.

FIG. 6 shows a detector with the electrodes arranged in a two-dimensional array on a single semiconductor device 401. On the surface of the semiconductor element 401, the anodes 402 are arranged in a two-dimensional array in such a manner that each anode 402 is surrounded by the first grid electrode 403, which in turn is surrounded by the second grid electrode 404, which in turn is surrounded by the third grid electrode 405. The semiconductor element 401 has a cathode 406 over the entire surface reverse to the surface thereof formed with the anodes 402, the first grid electrodes 403, the second grid electrodes 404 and the third grid electrodes 405. In the case where the ionizing radiation enters the semiconductor element 401, the electrons generated by ionization proceed toward the anode 402 located at the position nearest thereto, and therefore the position information can be obtained with each anode 402 regarded as a pixel. Every anode 402 is surrounded by the first grid electrode 403, and therefore only a very small amount of induced charge is generated in the anode 402 when the electrons move outside the first grid 403. Therefore, the crosstalks of the position information can be suppressed greatly as compared with the detector with only the anode divided and arranged on the semiconductor element. In this way, a detector for collecting the two-dimensional image data can produce information clearly defined for each pixel, thereby making it possible to produce a clear image. Applications of these detectors include medical imaging devices (gamma camera, single photon emission CT (SPECT), etc.)

A simple arrangement of the detectors shown in FIG. 3 can als, realize a structure substantially similar to FIG. 4. The structure of FIG. 6, on the other hand, can be realized simply by the process of printing the electrodes on a single tabular semiconductor crystal. Consider a detector having 200×200 pixels. Forty thousand assembly steps are eliminated and therefore the cost is reduced to at least about one tenth.

Figure 7:
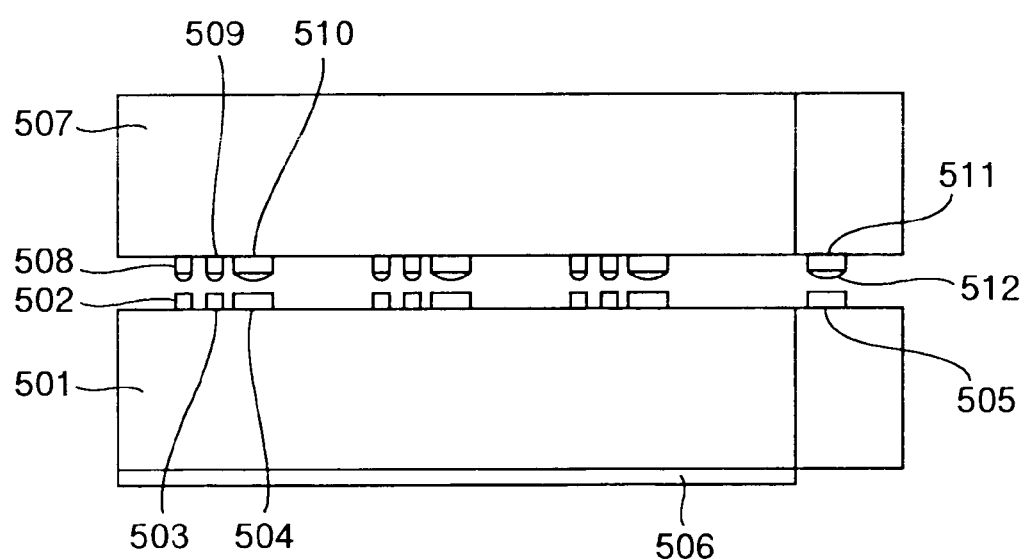
FIG. 7 is a diagram showing a packaging method for reading and voltage application for a multiple-grid electrode radiation detector in two-dimensional array.

FIG. 7 shows a method of connecting the multiple-grid electrode radiation detector shown in FIG. 6 and the package board of a signal reading circuit. A semiconductor element 501 has, on a certain part of the surface thereof, anodes 502, first grid electrodes 503, second grid electrodes 504 and a third grid electrode collective connecting portion 505. The semiconductor element also has a cathode 506 on a surface opposite to the anodes. The signal reading circuit package board 507 includes anode reading portions 508, first grid electrode bias portions 509, second grid electrode bias portions 510 and a third grid electrode collective bias portion 511.

A conductive portion holds a bump element (bump solder) 512 so that the conduction of the signal reading portion and the electrode application portion on a flat plate is achieved by such a method as applying heat and pressure between the semiconductor element 501 and the signal reading circuit package board 507. With this structure, the anodes 502 are biased by being individually connected to the anode reading portions 508, while at the same time reading the induced charge as a voltage signal. The first grid electrodes 503 and the second grid electrodes 504 are each given a potential by being connected individually to the first grid electrode bias portions 509 and the second electrode bias portions 510, respectively. The third grid electrode collective connecting portion 505 representing the third grid electrodes is an independent electrode to which a potential is applied from the third grid electrode collective bias portion 511. A separate potential is applied to the cathod 506.

According to this method, different potentials can be applied to different pixels (a set of the electrodes ranging from the anodes 502 to the grid electrode collective connecting portion 505). In order to assure uniformity of sensitivity for each pixel, for example, an appropriate potential can be applied only to the pixels on the flat bottom portion.

Figure 8:
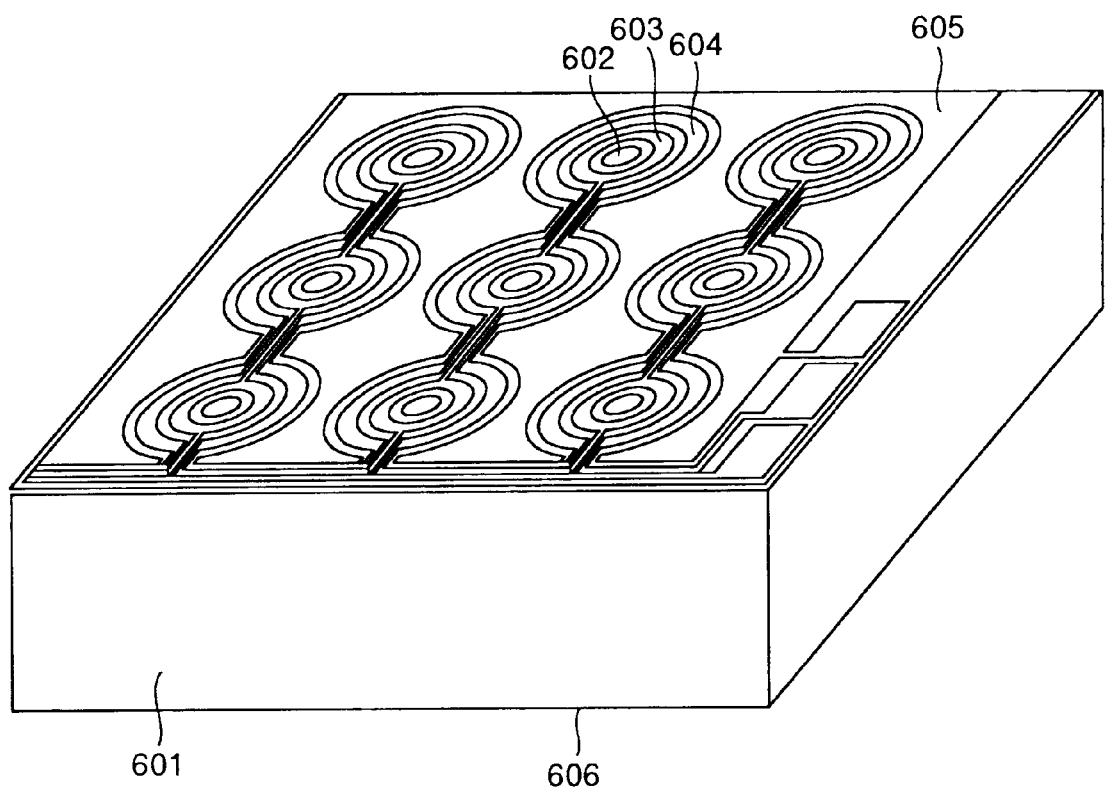
FIG. 8 is a diagram showing a two-dimensional array multiple-grid electrode radiation detector of collective grid electrode connection type.

FIG. 8 shows a detector capable of reading all the grid electrodes collectively. A plurality of anodes 602 are arranged in a two-dimensional array on a semiconductor element 601. All the first grid electrodes 403 in FIG. 4 are connected to each other into a single electrode as a collective first grid electrode 603. A plurality of columns of the collective first grid electrodes 603 are further connected to each other at the roots. The collective second grid electrodes 604 are kept out of contact with the collective first grid electrodes 603 and most efficiently so shaped as to surround all the pixels in the form of a single stroke. A collective third grid electrode 605, on the other hand, is so shaped as to fill up the remaining tart of the outer surface of the collective second grid electrodes 604 as viewed from the anodes 602. The surface of the semiconductor element 601 opposite to the anodes has a cathode 606.

Each collective second grid electrode 604 can arbitrarily have another collective second grid electrode 604 added adjacently thereto. Thus, it can be understood that the number of the grid electrodes is not limited also in the electrode structure shown in FIG. 8.

Figure 9:
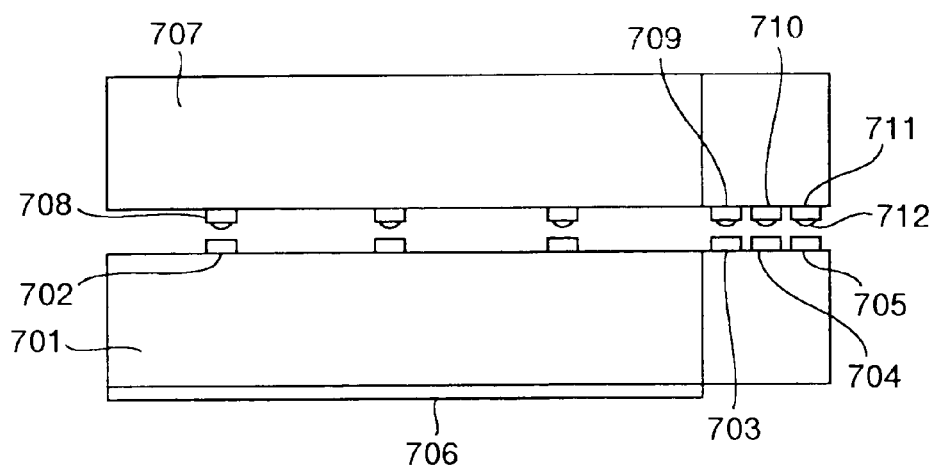
FIG. 9 is a diagram showing a two-dimensional array multiple-grid electrode radiation detector of collective grid electrode connection type.

FIG. 9 shows a method of packaging for reading a signal by applying a potential to the multiple-grid electrode radiation detector shown in FIG. 8.

A semiconductor element 701 has, on a certain surface thereof, anodes 702, a collective first grid electrode 703, a collective second grid electrode 704, a collective third grid electrode 705 and a cathode 706 which is arranged on the other surface of the semiconductor element 701. A package board 707 includes anode reading portions 708, a collective first grid electrode bias portion 709, a collective second grid electrode bias portion 710 and a collective third grid electrode bias portion 711. The electrodes and the board are connected to each other using bump elements 712.

The anodes 702 are individually connected to the anode reading portions 708 and each biased while at the same time reading the induced charge amount as a voltage signal. The collective first grid electrode 703, the collective second grid electrode 704 and the collective third grid electrode 705 are connected to the collective first grid electrode bias portion 709, the collective second grid electrode bias portion 710 and the collective third grid electrode bias portion 711, respectively, and supplied with a potential individually. The cathode 706 is supplied with a potential independently.

In the case where the number of grid electrodes is 3 with 200×200 pixels, as an actual example, the number of bumps used for connection is 120001 ($=200^2 \times 3+1$) for the structure shown in FIG. 4. In FIG. 7, however, the number is reduced to 40003 ($=200^2+3$) or about one third. This difference is further increased with the increase in the number of grid electrodes or, in particular, the number of pixels. The anodes 702 are required to be read individually for acquiring position information. Therefore, the method of connection of FIG. 9 in which the potentials are collectively applied to only other electrodes than the anodes 702 represents a case involving an optimum number of bumps. The packaging cost is directly proportional to the rate of decrease in the number of the connecting bumps. In the shown case, the cost is reduced to about one third.

Figure 10:
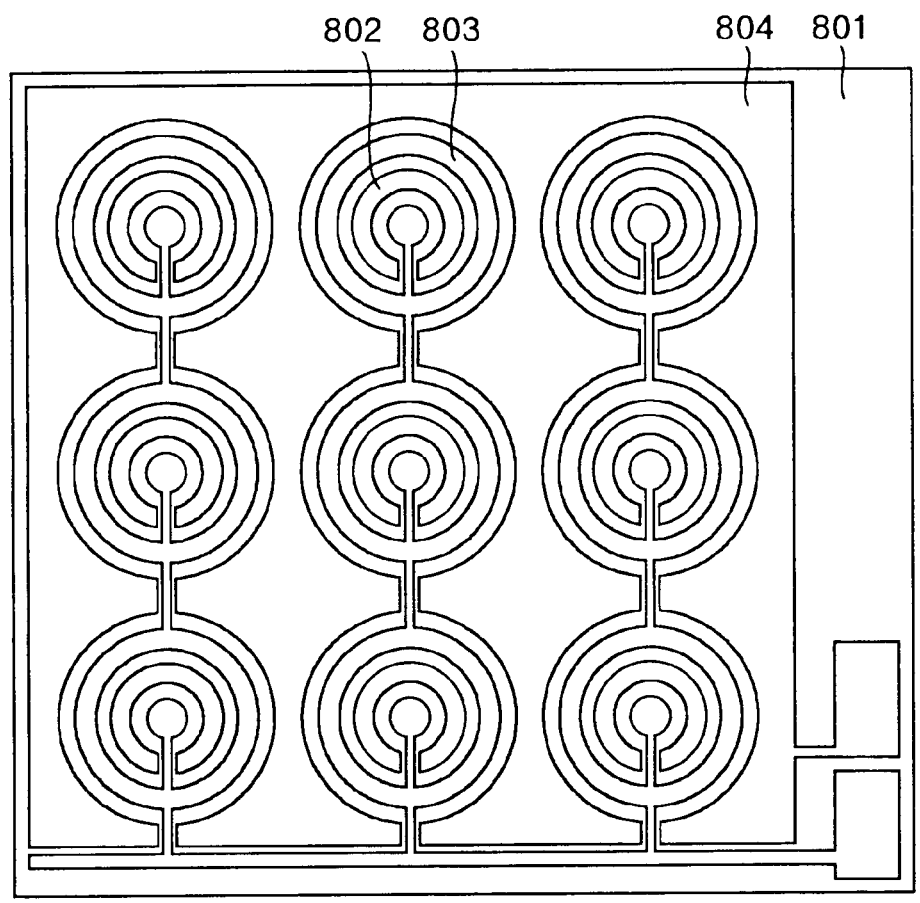
FIG. 10 is a diagram showing a two-dimensional array multiple-grid electrode radiation detector of C-shaped anode type.

FIG. 10 shows an electrode structure for connecting the collective grid electrodes according to the method of FIG. 3 in which the first grid electrode is used as an anode. The electrode structure includes, formed on a semiconductor element 801, a plurality of C-shaped anodes 802, first grid electrodes 803 filling up the entire neighborhood of the C-shaped anodes 802 without contacting them, and a second grid electrode 804 filling up the entire peripheral area around the first grid electrodes 803. In this case, too, the part having a high field strength around each anode covers a wide range, so that the time dependency of the signal according to the position of reaction in the semiconductor element 801 is reduced on the one hand and the detection efficiency is improved at the same time.

Figure 11:
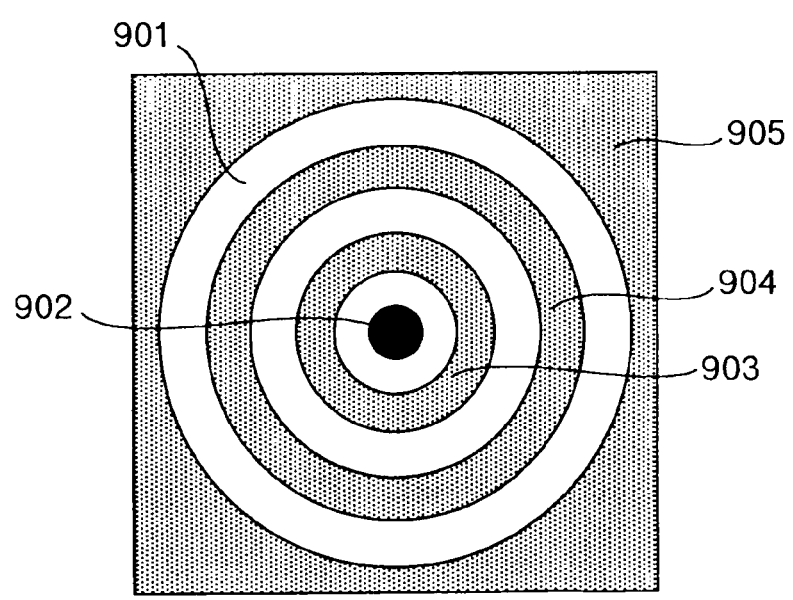
FIG. 11 is a bird's eye view of a multiple-grid electrode radiation detector of arbitrarily extended cathode type according to a modification of the invention.

FIG. 11 shows a multiple-grid electrode radiation detector having an arbitrarily extended cathode portion according to a modification of the invention shown in FIG. 3. A first grid electrode 903 surrounds an anode 902 formed on a semiconductor element 901, a second grid electrode 904 surrounds the first grid electrode 903, and a third grid electrode 905 surrounds the second grid electrode 904.

Figure 12:
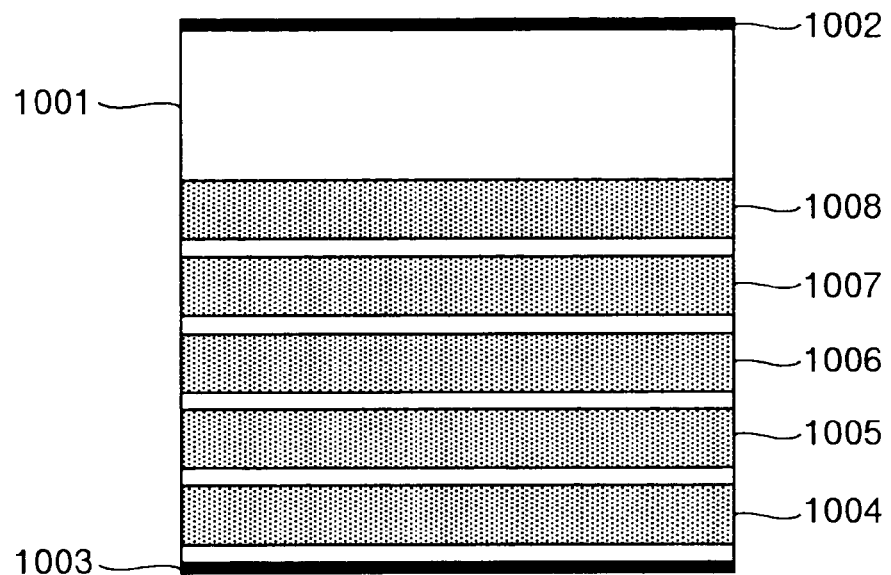
FIG. 12 is a side view of a multiple-grid electrode radiation detector of arbitrarily extended cathode type according to a modification of the invention.

FIG. 12 is a side view of a multiple-grid electrode radiation detector having an arbitrarily extended cathode portion. Arbitrarily extended cathodes 1004, 1005, 1006, 1007, 1008 exist between the surface 1002 of a semiconductor element 1001 formed with anodes and grid electrodes and a cathode 1003 formed on the reverse surface of the semiconductor element 1001.

Figure 13:
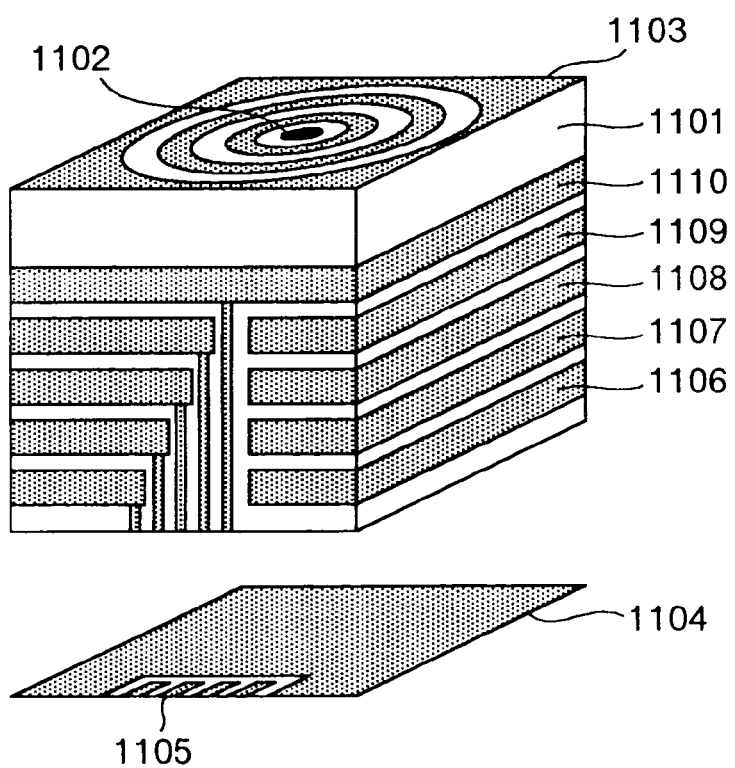
FIG. 13 is an overall view of a multiple-grid electrode radiation detector of arbitrarily extended cathode type according to a modification of the invention.

FIG. 13 is an overall view showing a multiple-grid electrode radiation detector having an arbitrarily extended cathode portion. The upper surface of a semiconductor element 1101 is formed with an anode 1102 and a plurality of grid electrodes 1103 surrounding the anode 1102. The bottom surface of the semiconductor element 1101, on the other hand, is formed with a cathode 1104 over substantially the entire surface and an arbitrarily extended cathode connecting portion 1105 at a part of the bottom surface. A first arbitrarily extended cathode 1106, a second arbitrarily extended cathode 1107, a third arbitrarily extended cathode 1108, a fourth arbitrarily extended cathode 1109 and a fifth arbitrarily extended cathode 1100 which are formed in the shape of band each have a linear conductive portion leading to the arbitrarily extended cathode connecting portion 1105 on the bottom surface. By appropriately selecting whether a potential is to be actually applied to the extended cathode portion, the side length of the cathodes of a single semiconductor element can be adjusted. In the case where the radiation reacts only in the neighborhood of the upper surface, the arbitrarily extended cathodes are used up to the upper part. In this way, it is possible to provide a detector having an apparent thickness meeting different reaction depths according to the quality and energy of the incident radiation.

Figure 14:
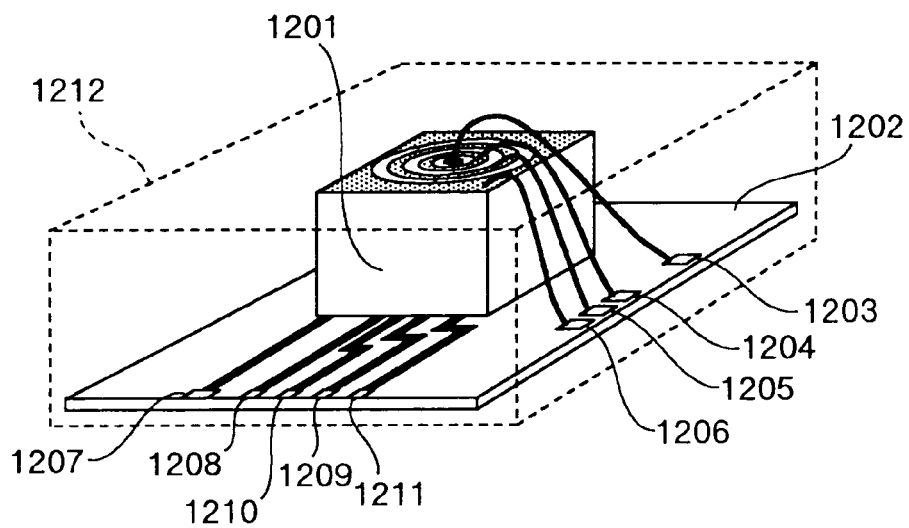
FIG. 14 is a diagram showing a packaging example of a multiple-grid electrode radiation detector of arbitrarily extended cathode type according to a modification of the invention.

FIG. 14 shows a packaging method according to the modification shown in FIG. 11. Conduction is established by bonding from each electrode formed on a semiconductor element 1201 toward an anode reading pad 1203, a first grid electrode reading pad 1204, a second grid electrode reading pad 1205 and a third grid electrode reading pad 1206 formed on a reading substrate 1202.

The lines leading to the arbitrarily extended cathode reading pads ranging from the first arbitrarily extended cathode reading pad 1207 to the fifth arbitrarily extended cathode reading pad 1211 are connected to a part of the bottom surface of the semiconductor element 1201 in superposed relation with the arbitrarily extended cathode connecting portion 1105 shown in FIG. 13 on the reading substrate 1202. In this way, the connection of each arbitrarily extended cathode from the semiconductor element 1201 is facilitated. All of these component parts are housed in a detector chassis 1212.

Figure 15:
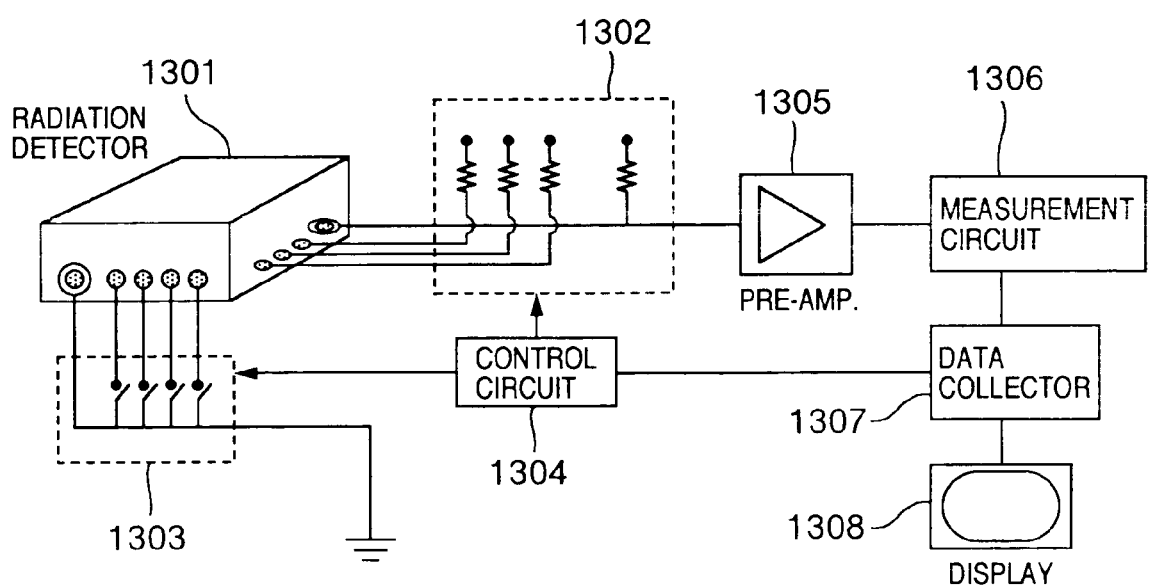
FIG. 15 is a diagram showing a configuration of a multiple-grid electrode radiation detector of arbitrarily extended cathode type according to a modification of the invention.

FIG. 15 shows a configuration of a multiple-grid electrode radiation detector 1301 having an arbitrarily extended cathode portion. The detector 1301 includes a voltage application circuit 1302 (the switch portion not shown) for applying a voltage to the detector 1301 and a cathode switching circuit 1303. A control circuit 1304 performs the selective control operation by applying a constant potential to the electrodes other than the anode.

The control circuit 1304 can also control the potential applied to the anode and the grid electrodes. The line of the anode leading from the voltage application circuit 1302 is connected to a data collector 1307 through a pre-amplifier 1305 and a measurement circuit 1306. The data collector 1307 exercises control also over the control circuit 1305. A display device 1308 is connected to the data collector 1307.

Also, according to this embodiment, the portion used as arbitrarily extended cathodes can be impressed with a free potential as well as the ground potential.

Figure 16:
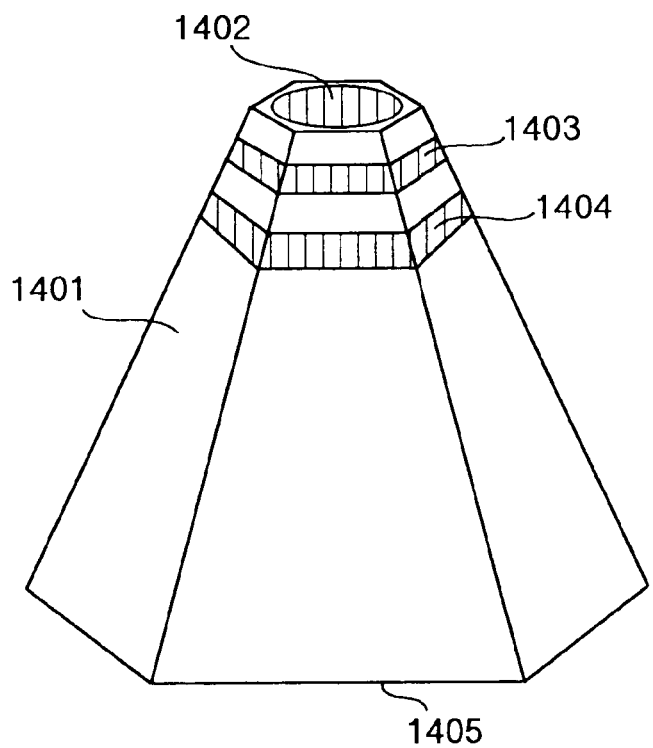
FIG. 16 is a diagram showing a six-sided pyramid multiple-grid electrode radiation detector constituting an element of a global direction detector according to a modification of the invention.

FIG. 16 shows a six-sided pyramid grid electrode detector making up an element of a global direction detector according to a modification of the invention. The top portion of the six-sided pyramid semiconductor element 1401 is cut off along a horizontal plane parallel to the bottom surface thereby to form an anode 1402. The side surface of the detector near to the anode 1402 is surrounded peripherally by the first grid electrode 1403, which in turn is surrounded by the second grid electrode 1404. The bottom surface of the detector is formed with a cathode 1405. This configuration is basically identical to that shown in FIG. 3. The area for generating the induced charge for the anode 1402 is limited to the neighborhood of the anode 1402 by the first grid electrode 1403. Further, the detector can rapidly collect electrons through a plurality of the grid electrodes. The number of the grid electrodes employed is not limited.

Figure 17:
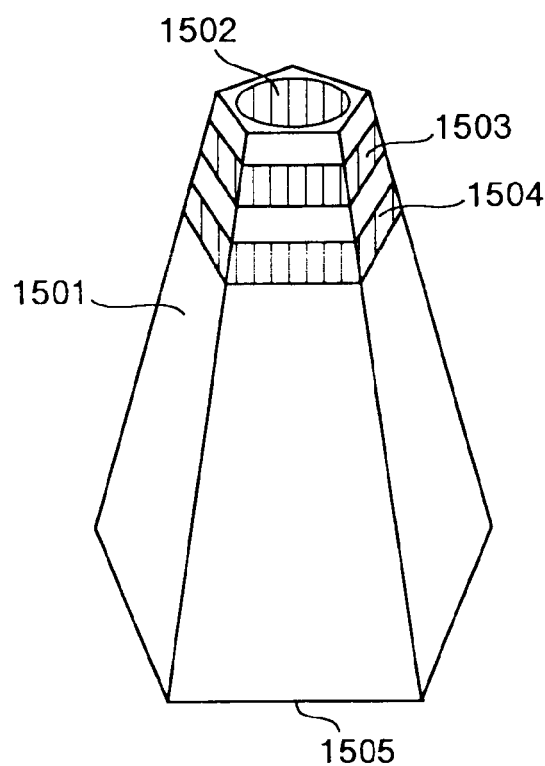
FIG. 17 is a diagram showing a five-sided pyramid multiple-grid electrode radiation detector constituting an element of a global direction detector according to a modification of the invention.

FIG. 17 shows a five-sided pyramid grid electrode radiation detector making up an element of a global direction detector. As in FIG. 16, the top portion of the five-sided pyramid semiconductor element 1501 is cut off in a horizontal plane parallel to the bottom surface thereby to form an anode 1502. The side surface near to the anode 1502 is surrounded peripherally by a first grid electrode 1503 which in turn is surrounded by a second grid electrode 1504. The bottom surface is formed with a cathode 1505.

Figure 18:
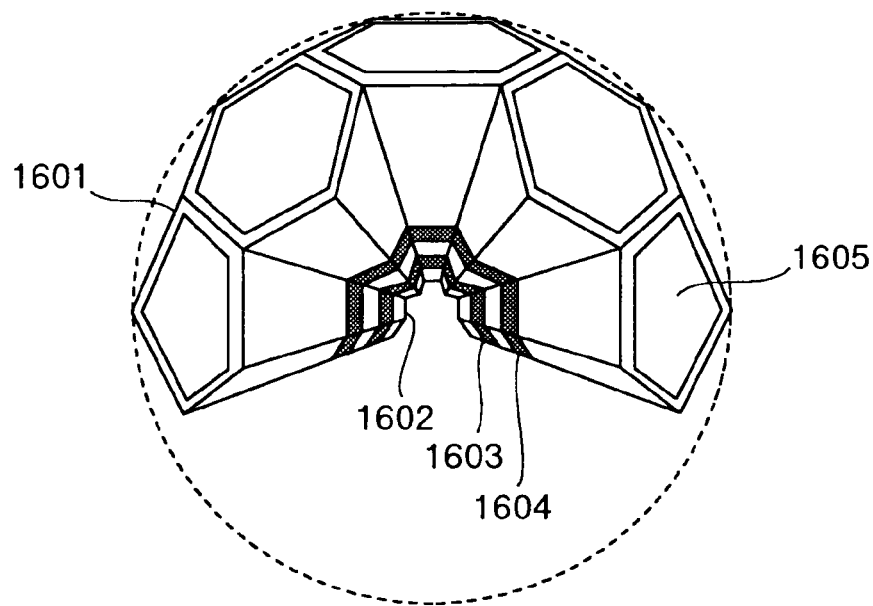
FIG. 18 is a diagram showing a partial configuration of a global direction detector according to a modification of the invention.

FIG. 18 shows an internal configuration of a global direction detector. Each semiconductor element 1601 includes an anode 1602, a first grid electrode 1603, a second grid electrode 1604 and a cathode 1605. The five-sided pyramid grid electrodes and the six-sided pyramid grid electrodes are set in position on each side thereof forming a part of the radius of a sphere. In this way, the first grid electrode 1603 and the second grid electrode 1604 of a given semiconductor element 1601 are kept in contact with the corresponding grid electrodes of an adjoining semiconductor element 1601, respectively. It therefore becomes easy to apply potentials collectively to the grid electrode of all the semiconductor elements. In the case where the five-sided pyramids and the six-sided pyramids are combined into the shape of a soccer ball, a detector having a substantially spherical shape without any gap can be formed.

Figure 19:
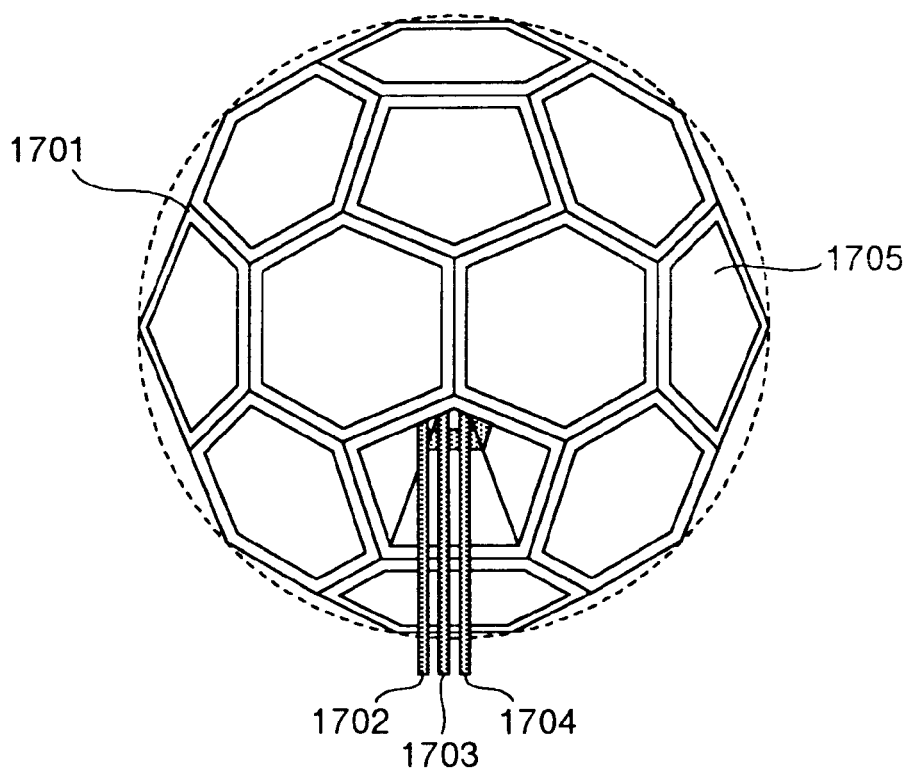
FIG. 19 is a diagram showing an overall configuration of a global direction detector according to a modification of the invention.

FIG. 19 shows a configuration of a 4π direction detector. Each semiconductor element 1701 includes an anode 1702, a first grid electrode 1703, a second grid electrode 1704 and a cathode 1705. The circuit in the last half stage of the detector is similar to the corresponding circuit shown in FIG. 1 and is not shown. In the case where all the anodes are collectively read by a single circuit in the last half stage, an omnidirectional 4π detector is completed, while a detector capable of producing angular information can be produced by reading the anodes individually. Also, a 2π detector can be completed by combining the pyramids corresponding to the portions making up a hemisphere. Further, other detectors having a desired solid angle can be produced as required. As described above, according to this modification, an omnidirectional detector can be produced by collectively reading the anodes 1702 substantially in the direction 4π, while a directional detector having a solid angle resolution can be produced arbitrarily by reading the anodes 1702 individually.

Even in the case where the spherical surface is not filled up, a detector having a higher solid angle resolution can be obtained by arranging pyramids or cones having a bottom surface small as compared with the height.

The invention described above is applicable to all the semiconductor detectors made of CdTe, CZT, GaAs, Si, etc.

By replacing each semiconductor element with a gas chamber having a measurement gas filled therein and also replacing the positive holes with positive ions, the configurations of the invention described above can all be easily used as a gas detector such as a gas ionizing box or a proportional counter.

Figure 20:
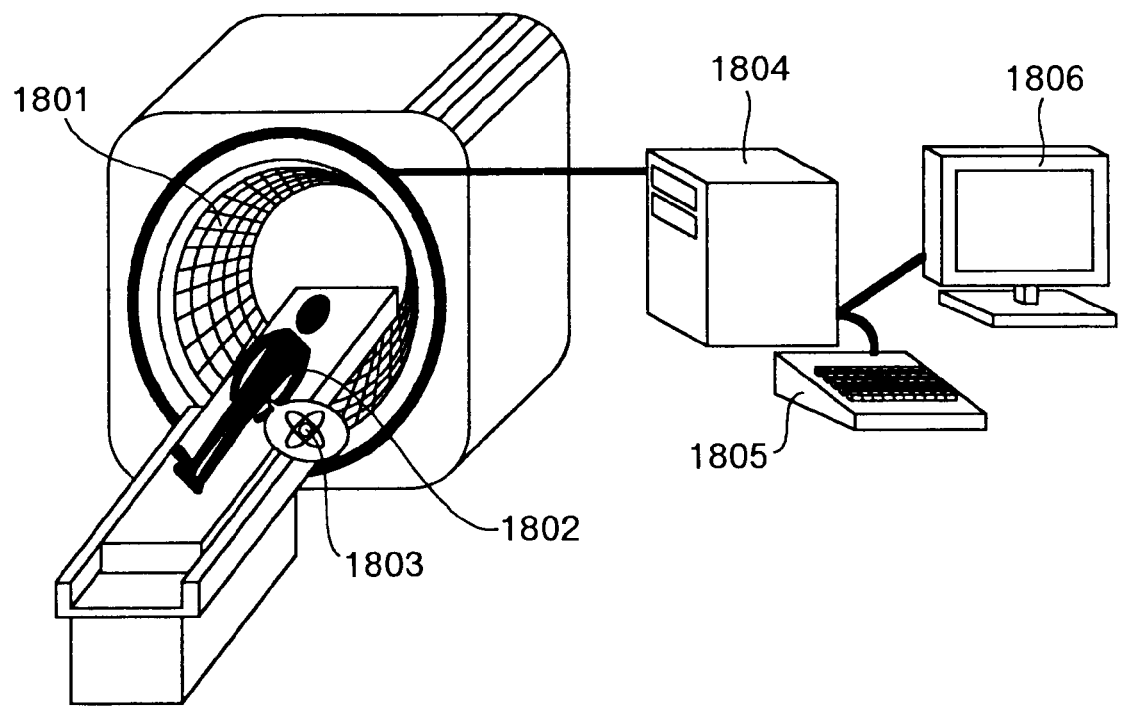
FIG. 20 is a diagram showing a PED system comprising a multiple-grid electrode radiation detector according to the invention.

FIG. 20 shows a PUT system having built therein a multiple-grid electrode radiation detector. A plurality of multiple-grid electrode radiation detectors 1801 are arranged around a human body 1802. The radio isotope 1803 dosed in the human body 1802 is F-18 or the like contained in FDG (fluoro deoxy glucose) having such a chemical form as to be concentrated in a seat of disease in the human body. The multiple-grid electrode radiation detector 1801 is connected to a data collection-analyzer 1804 in the last half stage, and includes an input/output device 1805 and an imaging/display device 1806.

F-18 releases positive electrons at the time of decay, and the positive electrons react with electrons in the environment near the releasing point thereby to generate 511-keV γ ray photons at almost 180-degree opposite positions. The 180-degree opposite γ rays are detected simultaneously by a plurality of the detectors 1801 as radiation generated from a radio isotope 1803 thereby to acquire position information. The efficiency of simultaneous detection is equal to the square of the detection efficiency on one side, and therefore a detector having a high detection efficiency can be produced.

As described above, a high detection efficiency can be maintained.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A radiation detector comprising:
   a semiconductor element irradiated for generating positive holes and electrons;
   a cathode and an anode impressed with a voltage in such a manner as to form an electric field in said semiconductor element;
   a first grid electrode; and
   a second grid electrode for forming an electric field with said first grid electrode, wherein said anode is ring-shaped, and said first grid electrode is arranged so as to fill in near portion inside said ring and arranged in a ring-shaped form so as to surround near portion outside said ring, and said second grid electrode is arranged in a ring-shaped form so as to surround said first grid electrode.

2. A radiation detector according to claim 1, wherein the distance between said anode and said first grid electrode is shorter than the distance between said first grid electrode and said second grid electrode.

3. A radiation detector according to claim 1, comprising a plurality of said cathodes capable of being selectively impressed with a voltage.

4. A radiation detector according to claim 1, wherein the distance between said anode and said first grid electrode is shorter than the mean life distance of electrons dependent on the semiconductor element.

5. A radiation detector according to claim 1, further comprising a third grid electrode arranged on the side of said second grid electrode far from said anode and impressed with a voltage lower than said voltage of said second grid electrode.

6. A radiation detector according to claim 5, further comprising a fourth grid electrode arranged so as to surround said third grid electrode in a ring-shaped form, said fourth grid electrode being impressed with a voltage lower than said voltage of said third grid electrode.

7. A radiation detector according to claim 1, wherein said cathode, said anode, said first grid electrode and said second grid electrode are combined as a set, said radiation detector comprising a plurality of said sets, wherein a predetermined grid electrode in a given set has the same voltage as a corresponding grid electrode in a different set.

8. A radiation detector according to claim 1, wherein said cathode, said anode, said first grid electrode and said second grid electrode are combined as a set, said radiation detector comprising a plurality of said sets, wherein said second grid electrode is arranged at a distance from said anode at least by one fourth of the distance from said anode to an anode in an adjacent set.

9. A radiation detector according to claim 1, wherein the distance between said anode and said cathode is variable.

10. A radiation detector according to claim 1, wherein said first grid electrode and said second grid electrode are capable of being impressed with a voltage independently of each other.

11. A radiation detector according to claim 1, wherein said anode, said first grid electrode and said second grid electrode are concentrically arranged.

12. A radiation detector according to claim 11, wherein a center of concentric arrangements of said anode, said first grid electrode and said second grid electrode coincides with a center of said semiconductor element.

* * * * *